United States Patent [19]

Mori et al.

[11] 4,130,805
[45] Dec. 19, 1978

[54] NOISE CLEARING SYSTEM

[75] Inventors: Masaharu Mori, Warabi; Kiyoshi Amazawa, Ohmiya, both of Japan

[73] Assignee: Clarion Co., Ltd., Tokyo, Japan

[21] Appl. No.: 790,603

[22] Filed: Apr. 25, 1977

[30] Foreign Application Priority Data

Apr. 30, 1976 [JP] Japan ................................. 51/49657

[51] Int. Cl.² .............................................. H04B 1/10
[52] U.S. Cl. ...................................... 325/473; 325/65; 325/476; 358/167
[58] Field of Search ................................ 325/473–476, 325/478, 479, 363, 369, 371, 65, 313, 323, 377, 379, 348, 349; 328/165, 162; 179/1 VL, 1 P; 358/157, 167, 177

[56] References Cited
U.S. PATENT DOCUMENTS

| 3,213,450 | 10/1965 | Goor | 325/476 |
| 3,851,253 | 11/1974 | Eastmond | 325/348 |
| 3,947,636 | 3/1976 | Edgar | 325/474 |
| 3,978,412 | 8/1976 | Frerking | 325/478 |
| 3,979,683 | 9/1976 | Ikeda | 325/474 |
| 4,006,421 | 2/1977 | Mermoz | 325/476 |

Primary Examiner—Benedict V. Safourek
Assistant Examiner—Tommy P. Chin
Attorney, Agent, or Firm—Biebel, French & Nauman

[57] ABSTRACT

A noise clearing system is described which comprises a means for applying a signal representing the existing period of an impulsive noise which is contained in an incoming signal, a means for detecting the impulsive noise, a means for reversing the phase of the detected noise, a means for summing the phase-reversed noise and the incoming signal to clear the noise, and a means for actuating the noise detecting means and the noise phase-reversing means in response to the noise period representing signal during the existing period of the noise.

5 Claims, 3 Drawing Figures

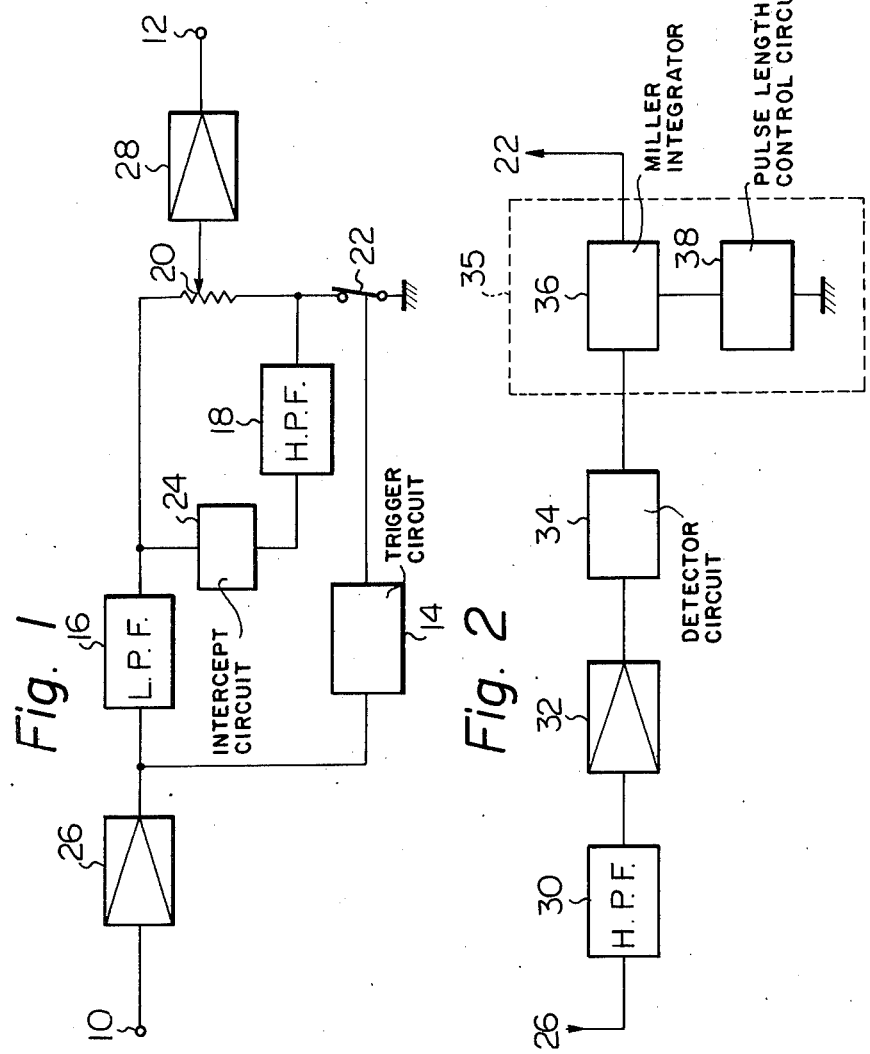

NOISE CLEARING SYSTEM

BACKGROUND OF THE INVENTION

This invention relates to a noise clearing system, and more particularly to a system for clearing an impulsive noise such as an ignition noise of an automobile, which is preferably connected to the output of a detector in an FM receiver.

In the prior art noise clearing system connected to the output of the detector in an FM receiver, it is known that, by intercepting the signal on the main siganl path that is an audio signal containing an impulsive noise, the noise is taken out and eliminated from the main path during the existing period of the noise.

Accordingly, it has been required that the prior art system should be provided with a further circuit, for example, a storage capacitor, for compensating the lack of the audio signal caused by intercepting the signal on the main path.

SUMMARY OF THE INVENTION

The present invention is provided with a means for applying a signal representing the existing period of an impulsive noise contained in an incoming signal, and resides in that said impulsive noise is taken out as a noise pulse which is reversed in phase in response to said noise period representing signal and then added to the incoming signal on the main signal path to clear the noise. According to this invention, the means for passing the noise therethrough is operated only during the existing period of the noise to clear the noise alone accurately and effectively.

It is an object of this invention to provide a novel noise clearing system.

Another object of the invention is to provide a noise clearing system by which an impulsive noise contained in an incoming signal is taken out and cleared without intercepting the audio signal containing the impulsive noise on the main signal path and without causing any lack of the audio signal.

BRIEF DESCRIPTION OF THE DRAWING

FIG. 1 is a block diagram embodying the noise clearing system of the present invention;

FIG. 2 is a block diagram showing the construction of one block shown in FIG. 1.

DESCRIPTION OF THE PREFERRED EMBODIMENT

Figure 3:
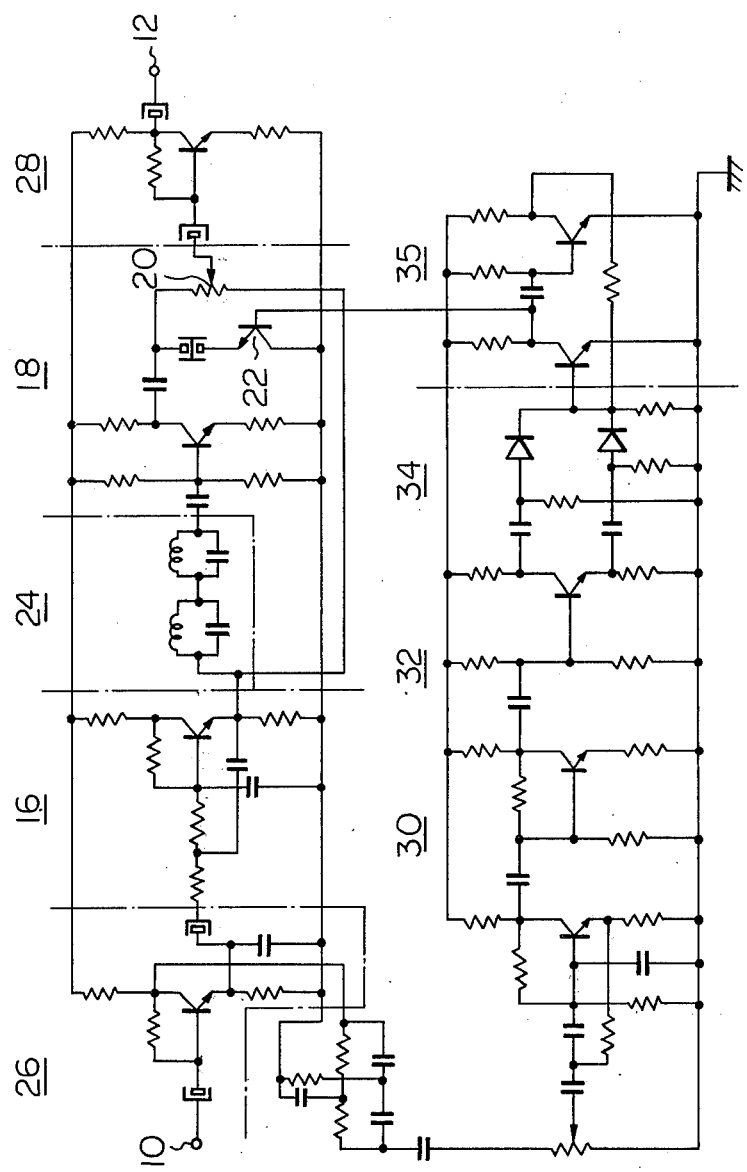
FIG. 3 is an electric circuit embodying the block diagram shown in FIG. 1.

FIG. 1 shows one embodiment of the present invention. An input terminal 10 and an output terminal 12 may be connected to the output of a detector in an FM receiver and a speaker driving circuit, respectively. The terminal 10 is connected to a circuit 14 for applying a noise period representing signal through an input amplifier 26. The output of the amplifier 26 is also connected to a delay circuit 16 in the form of a low pass filter (L.P.F.). The I.P.F. 16 functions to delay the output signal of the amplifer 26, the delay quantity corresponding to that of the circuit 14. In other words, the noise pulse on the output of the L.P.F. is synchronized in time with the signal pulse on the output of the circuit 14. The output signal of the L.P.F. 16 is applied to a first input of a summing means in the form of a potentiometer 20. The second input of the summing means is grounded through a switch 22. The moveable tap of the summing means 20 is then connected to the output terminal 12 through an amplifier 28.

Also, the output of the L.P.F. 16 is connected to the second input of the summing means 20 through a high pass filter (H.P.F.) 18. This H.P.F. functions to pass therethrough a noise signal contained in an incoming signal, to reverse the phase of the noise signal and then to apply it to the summing means 20.

It will be appreciated that, in order to insure that both of the amplitude of a pilot tone (19 KHz) of an FM stereophonic signal and the amplitude of a sub-carrier (38 KHz) are not attenuated when the noise is cleared, a circuit 24 for intercepting both the pilot tone and the sub-carrier may be inserted between the L.P.F. 16 and the H.P.F. 18.

If a noise-containing signal appears on the output of the amplifier 26, the circuit 14 output a signal representing the existing period of the noise, and then this output signal causes the switch 22 to open during the noise existing period. Since the switch 22 is normally in an ON condition, the output of the H.P.F. 18 is grounded so that the output signal of the H.P.F. 18 is not applied to the summing means 20 while the switch is in an ON condition. A noise pulse is extracted by the H.P.F. 18 from an incoming signal which has been delayed as much as the delay quantity of the circuit 14 by the L.P.F. 16, and is differentially added to the incoming signal in the summing means 20 since the switch 22 is in an OFF condition while the noise is being extracted. Therefore, on the movable tap of the means 20, there occurs an incoming signal with the noise component having been cleared. The switch 22 is preferably an electronic switch.

The circuit 14 for applying a noise period representing signal is well known to those skilled in the art. Because the period of a noise pulse normally has a predictable constant value, it suffices only to detect the incoming of a noise pulse without measuring the period of an actual noise pulse. The circuit 14 may be constructed so that the switch 22 is opened by a trigger pulse representing the incoming of a noise pulse, and the opened condition of said switch is maintained for a predetermined, that is, predicted length of time of the noise pulse.

FIG. 2 shows concretely a trigger pulse generating circuit for accomplishing the above purpose. The output of the amplifier 26 is connected to the input of an H.P.F. 30, and the output of said H.P.F. 30 is connected to the input of a detector 34 through an amplifier 32. The output of the detector 34 is connected to the trigger input of the switch 22, for example, a semiconductor switch which is normally biased to an ON condition, through a circuit 35 for generating a pulse of a predetermined period. The circuit 35 comprises a Miller integrator 36 and a pulse length control circuit 38, but said circuit 35 may be replaced by a monostable multivibrator.

FIG. 3 illustrates in detail an electric circuit embodying the system shown in FIG. 1, in which a monostable multivibrator comprising two NPN type transistors is used in place of the block 35 shown in FIG. 2.

What is claimed is:

1. An impulsive noise clearing system for an FM stereophonic receiver, comprising:
   delay means for receiving and delaying an incoming FM stereophonic signal, including a pilot tone and a subcarrier, intercept means, connected to the output of said delay means, for intercepting said pilot tone and said subcarrier, and for providing the remainder of said incoming FM stereophonic signal at an output, phase reversing means, connected to the output of said intercept means, for detecting an impulsive noise signal contained within said incoming FM stereophonic signal and for providing a phase reversed impulsive noise signal, means for receiving continually said incoming FM stereophonic signal, and for providing a trigger pulse signal equal in duration to the period of impulsive noise contained within said incoming FM stereophonic signal, summing means, connected to said delay means, for summing said incoming FM stereophonic signal with said phase reversed impulsive noise signal from said phase reversing means, and switching means, connected to the output of said phase reversing means, for applying said phase reversed impulsive noise signal to said summing means upon receipt of said trigger pulse signal, whereby said impulsive noise signal is cleared from said incoming FM stereophonic signal at the output of said summing means.

2. The impulsive noise clearing signal of claim 1 in which said switching means comprises means for grounding the output of said phase reversing means when no impulsive noise is present in said incoming FM stereophonic signal.

3. The impulsive noise clearing system of claim 1 in which said delay means comprises a low pass filter.

4. The impulsive noise clearing system of claim 1 in which said phase reversing means comprises an active high pass filter.

5. The impulsive noise clearing system of claim 1 in which said summing means comprises a resistance means having a first input connected to the output of said delay means, a second input connected to the output of said phase reversing means, and tap output means adjustable to provide a summed output signal consisting of signals applied to said first and second inputs of said resistance means.

* * * * *